Figure 1:
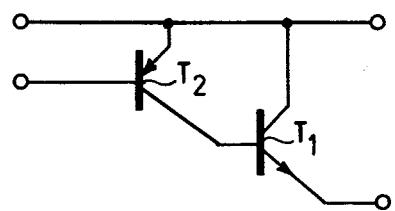

United States Patent [19]

Bonis et al.

[11] 4,122,482
[45] Oct. 24, 1978

[54] VERTICAL COMPLEMENTARY BIPOLAR TRANSISTOR DEVICE WITH EPITAXIAL BASE ZONES

[75] Inventors: Maurice Bonis, Herouville; Bernard Roger, Carpiquet, both of France

[73] Assignee: U.S. Philips Corporation, New York, N.Y.

[21] Appl. No.: 821,997

[22] Filed: Aug. 5, 1977

Related U.S. Application Data

[60] Continuation of Ser. No. 640,707, Dec. 15, 1975, abandoned, which is a division of Ser. No. 438,292, Jan. 31, 1974, Pat. No. 3,959,039.

[30] Foreign Application Priority Data

Feb. 2, 1973 [FR] France .................................. 73.03748

[51] Int. Cl.² .......................................... H01L 27/04
[52] U.S. Cl. ...................................... 357/46; 357/44; 357/55; 357/56
[58] Field of Search .................. 357/44, 46, 55, 56, 357/34, 90; 307/315

[56] References Cited

U.S. PATENT DOCUMENTS

| | | | |
|---|---|---|---|
| 3,103,599 | 9/1963 | Henkels | 357/44 |
| 3,423,651 | 1/1969 | Legat et al. | 357/34 |
| 3,427,515 | 2/1969 | Blicher et al. | 357/90 |
| 3,624,454 | 11/1971 | Adkinson et al. | 357/46 |
| 3,868,722 | 2/1975 | Le Can et al. | 357/46 |

FOREIGN PATENT DOCUMENTS 1,231,806 5/1971 United Kingdom .................. 357/44

OTHER PUBLICATIONS

RCA Designers Handbook, 1972, pp. 576-579.

Primary Examiner—Stanley D. Miller, Jr.
Assistant Examiner—James W. Davie
Attorney, Agent, or Firm—Frank R. Trifari; Daniel R. McGlynn

[57] ABSTRACT

A semiconductor device including a substrate of first conductivity type provided with an epitaxial region of the opposite conductivity type. The base of a first vertical bipolar transistor is formed by a localized epitaxial layer present above the first region, the collector of the transistor and the base of a second vertical bipolar transistor adjoining each other in the region.

15 Claims, 18 Drawing Figures

VERTICAL COMPLEMENTARY BIPOLAR TRANSISTOR DEVICE WITH EPITAXIAL BASE ZONES

This is a continuation of Application Serial No. 640,707, filed Dec. 15, 1975, now abandoned, which was a divisional of Application Ser. No. 438,292, filed Jan. 31, 1974, now U.S. Pat. No. 3,959,039.

The invention relates to a semiconductor device having a semiconductor body comprising at least two bipolar transistors of which corresponding zones are of opposite conductivity types (npn and pnp), in which the semiconductor body comprises a substrate region of a first conductivity type on which a first epitaxial layer of the opposite conductivity type is present, in which the collector zone of the first transistor is constituted by at least a part of the substrate region, the base zone of the first transistor and the collector zone of the second transistor are constituted by parts of the first epitaxial layer, and an emitter zone is present in each of the base zones. In many circuits for power amplification the output transistor is controlled by a complementary transistor, that is to say a transistor of which the corresponding zones show conductivity types opposite to those of the first transistor. In this manner, for example, an npn transistor is controlled by a pnp transistor. A pnp transistor may also be used for controlling an assembly which is formed by two npn transistors and which is known by the name of Darlington amplifier. In order to integrate circuits of this type in the same device it has been endeavored to realize at least one npn transistor and one pnp transistor in the same semiconductor plate, the base of the first transistor being connected to the collector of the second transistor. In known devices having two integrated complementary transistors, the transistors have diffused base zones or only one of the transistors has an epitaxial base zone while the other transistor has a diffused base zone. (Instead of diffused zones, for example, zones formed by ion implantation may also be used.) In this case, however, the two transistors do not both have both an epitaxial base zone and an epitaxial collector zone. The known devices of which one of the transistors has a diffused base zone have certain drawbacks which are inherent in such a base zone; the thickness of the base zone is less readily defined, the doping concentration is irregular and it is difficult to optimize the characteristics of the transistors and make them reproducible. As a result of this, the two transistors show certain differences, while the thermal deviations often considerably disturb the operation of the device. The output transistor which usually is a power transistor is difficult to obtain via diffusion. Moreover, planar transistors having a diffused base are more sensitive to "second breakdown" than the transistors having an epitaxial base.

One of the objects of the present invention is to mitigate said drawbacks. For that purpose, the invention provides in particular a monolithic assembly having at least two complementary transistors with epitaxial base, which preferably constitute an amplifier, the base of one transistor being connected to the collector of the other transistor.

Another object of the invention is to provide a device having two complementary transistors which combines the advantages of an integrated structure with the advantages of the devices having an epitaxial base.

According to the invention, a semiconductor device of the type mentioned in the preamble is characterized in that the base zone of the second transistor is constituted by a second epitaxial layer of the first conductivity type which is present above the part of the epitaxial layer which constitutes the collector zone of the second transistor, the collector zone of the second transistor and the base zone of the first transistor adjoining each other.

The first and second transistor of the device both have an epitaxial base zone and are less sensitive to "second breakdown" than a planar transistor which is obtained, for example, by double diffusion. Both transistors have the advantages which result from the better definition of the base thickness and of the better homogeneity of the base doping, which enables a better control of the properties of the transistors.

The fact that the base zone of the first transistor and the collector zone of the second transistor adjoin each other provides an optimum electric connection as a result of which the assembly formed by the two transistors constitutes an integrated pnp-npn Darlington circuit. Moreover, the structure according to the invention has the advantage that the thermal connection between the two transistors is of a very good quality.

The first epitaxial layer may have a constant thickness as a result of which the base zone of the first transistor and the collector zone of the second transistor have the same thickness. The second epitaxial layer then forms an additional layer at the area of the second transistor.

However, a preferred embodiment of the device is characterized in that the part of the first epitaxial layer which constitutes the collector zone of the second transistor is thinner than the part of the first epitaxial layer which constitutes the base zone of the first transistor, the difference in thickness being substantially equal to the thickness of the epitaxial layer which constitutes the base zone of the second transistor. In this manner the upper face of the base zone of the second transistor lies at the same level as the upper face of the base zone of the first transistor.

It is advantageous when the epitaxial material which constitutes the base zone of the second transistor entirely fills the cavity which is caused by the difference in thickness of the parts of the first epitaxial layer; in this manner the upper face of the device shows no important level difference whatsoever, which facilitates the provision of reliable electric connections via localized metal layers.

In the device according to the invention it should be borne in mind that a thyristor effect may occur in the four-layer-structure which is constituted by the emitter zone, the base zone and the collector zone of the transistor, and the collector zone of the other transistor. In order to avoid the thyristor effect the amplification of the stray transistor should be reduced as much as possible. In this case the emitter zone of the stray transistor is constituted by the base zone of the second transistor and the collector zone of the stray transistor is constituted by the substrate region.

It is advantageous when the first epitaxial layer consists of at least two component layers present one on top of the other, the upper component layer having a higher doping than the lower component layer adjoining the substrate region. The more highly doped layer of the first epitaxial layer is thus present between the lower doped layer which is in contact with the substrate region and the base zone of the second transistor which constitutes the emitter zone of the stray transistor. The current amplification of the stray transistor decreases when the doping concentration of the upper layer is increased, the higher doping concentration giving rise to a shorter life time for charge carriers.

Moreover, the upper component layer eliminates the danger of the formation of an inversion layer at the surface of the base zone of the first transistor. When the thickness of the upper component layer is larger than the thickness of the emitter zone of the said first transistor, said layer may prevent the depletion zone from extending up to the emitter zone when the base-collector junction is reversely biased.

An advantageous embodiment of the device is characterized in that the substrate region comprises a surface layer having a lower doping than the underlying part of the substrate region, on which surface layer the first epitaxial layer extends. As a result of said lower doped surface layer which is present immediately below the first epitaxial layer, the breakdown voltage of the base-collector junction of the first transistor is larger than the breakdown voltage in the absence of the said surface layer; when the junction is live, the depletion zone may extend further in the substrate region which serves as a collector zone.

Moreover, the lower doped surface layer prevents the doping material from the substrate region from diffusing to the first epitaxial layer in an undesired manner during the growth.

It is also advantageous when the base zone of the second transistor comprises two layers present one on top of the other and of which the layer adjoining the surface is more highly doped than the underlying layer. The more highly doped upper layer eliminates the risk of the formation of an inversion layer at the surface of the base zone. When the thickness of the upper layer is larger than that of the emitter zone of the same transistor, the said upper layer prevents the depletion zone from extending up to the emitter zone when the base-collector junction of the transistor is reversely biased.

A further preferred embodiment is characterized in that the semiconductor body comprises at least a third transistor of which the corresponding zones have the same conductivity type as those of the first transistor, the base zone of the first and the third transistor being insulated from each other by a groove the depth of which is larger than the thickness of the first epitaxial layer at the area of base zones, the substrate region constituting a common collector zone of the first and the third transistor.

The transistors particularly advantageously form part of a Darlington circuit. In addition, the semiconductor body comprises advantageously an npn transistor of the same structure as the first transistor and of which the collector zone is constituted by the substrate region and the base zone by the first epitaxial layer, which npn transistor is separated from the first transistor by a groove which extends at least down to the substrate region.

An important preferred embodiment is furthermore characterized in that the device constitutes a push-pull amplifier and comprises a second semiconductor body having two further epitaxial transistors of the same structure as the first transistor connected according to a Darlington circuit, the assembly being mounted on the same base plate and provided in the same package.

It is possible to add at least a third transistor to the two transistors of the device according to the invention of which one is an npn transistor and the other is a pnp transistor which together constitute a Darlington amplifier, the third transistor having the same structure as one of the two other transistors.

The invention also relates to a method of manufacturing the above-described devices in which the starting material is a substantially flat surface region of a first conductivity type on which a first epitaxial layer of the opposite conductivity type is provided. According to the invention the method is characterized in that a second monocrystalline layer of the first conductivity type is provided by epitaxial growth and locally covers the surface of the first epitaxial layer, after which emitter zones are provided by introduction of doping material in the first epitaxial layer and in the second epitaxial layer. The emitter zones may be provided in various manners, for example, by ion implantation, or usually, however, by diffusion.

According to a preferred embodiment the method according to the invention is characterized in that a monocrystalline layer of the first conductivity type is grown epitaxially on the whole surface of the first epitaxial layer, after which the layer is removed partly by etching with the exception of the part above the collector zone of the second transistor.

According to another preferred embodiment the method is carried out so that a mask is provided on the first epitaxial layer. A window in the mask leaves a part of the surface above the collector zone of the second transistor exposed, after which a monocrystalline layer of the first conductivity type is grown locally at the location of the window.

Depending upon the mask used, several methods may be used to obtain the localized epitaxial layer. According to a first method, for example, the epitaxial layer is provided only on the desired uncovered surface part, in which no material is deposited on the surface of the mask. According to another preferred embodiment, monocrystalline material is provided on the uncovered crystalline surface, in which the said material of polycrystalline structure is deposited on the surface of the mask. Via selective etching which is facilitated due to the fact that the polycrystalline material is attacked more rapidly than the monocrystalline material, a localized layer is then obtained which is comparable to that which is obtained by the previous embodiment.

A further preferred embodiment of the method according to the invention is characterized in that a cavity is formed locally in the first epitaxial layer by etching and extends only over a part of the thickness thereof, after which a monocrystalline layer of the first conductivity type is formed by epitaxial growth in the cavity, the thickness of the layer being substantially equal to the depth of the cavity.

The method according to the invention may be implemented by diffusions to obtain the various highly doped layers with which the device according to the invention is provided in certain embodiments. For example, prior to the provision of the localized epitaxial layer which is to form the base zone of the second transistor, a diffusion may be carried out with a doping of the opposite conductivity type throughout the upper face. The depth over which said diffusion is carried out is preferably slightly larger than the thickness of the emitter zone of the first transistor.

In this manner the diffused layer is more highly doped than the underlying part of the first epitaxial layer; due to the diffused layer it is possible to reduce the amplification of the stray transistor, to eliminate the risk of the formation of an inversion layer at the surface of the base zone of the first transistor, and to avoid that the depletion zone of the collector - base junction would extend up to the emitter zone.

When a cavity is to be obtained via etching in the first epitaxial layer so as to provide in it the second epitaxial layer, the above-mentioned diffusion should be carried out after the etching treatment.

In the same manner, a diffusion of a doping material determining the first conductivity type is advantageously carried out at the surface of the localized epitaxial layer which constitutes the base zone of the second transistor. The diffusion provides an upper layer which is more highly doped than the lower layer of the second epitaxial layer and eliminates the risk of the formation of an inversion layer at the surface of the base zone, while, when the depth of the diffusion is sufficient, it is possible to prevent the depletion zone of the collector-base junction of the transistor from extending down to the emitter.

Upon providing the first epitaxial layer on the substrate region it may occur, when the substrate is highly doped, that doping material diffuses in the grown material. In this case it is preferred to provide the substrate region with a low-doped surface layer, for example, by providing an epitaxial layer of the same conductivity type as the substrate region but with a doping concentration which is considerably smaller, after which the first epitaxial layer of the opposite conductivity type is provided on the lastmentioned surface layer. It is advantageous if the surface layer and subsequently the first epitaxial layer are provided during one uninterrupted operation.

The invention may be used for the manufacture of an assembly having two transistors of opposite conductivity types and in particular for the manufacture of a pnp-npn Darlington amplifier. The invention may also be used for realizing integrated circuits comprising an assembly having two transistors of opposite conductivity types and other elements, in particular one or several other transistors.

The invention may be used in particular in realizing amplifiers for the processing of audio-frequency signals in which the amplifiers comprise inter alia a pnp transistor which controls an npn output transistor or an npn-npn output Darlington circuit.

Figure 4:
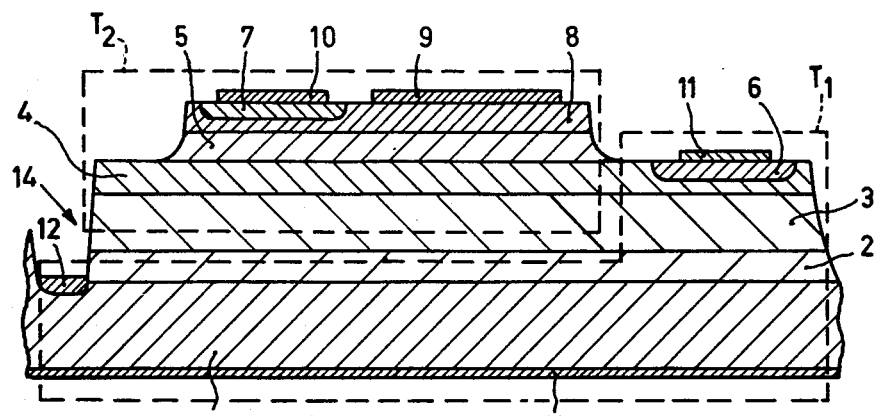
Figure 5:
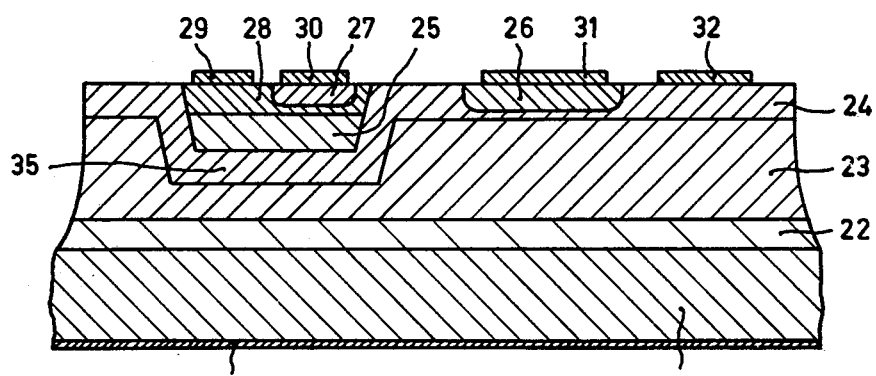
Figure 2:
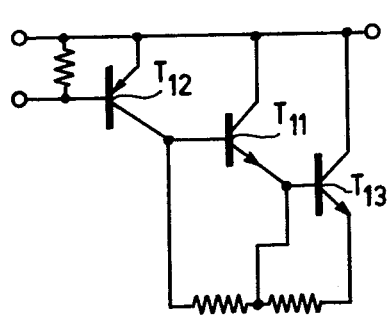
Figure 3:
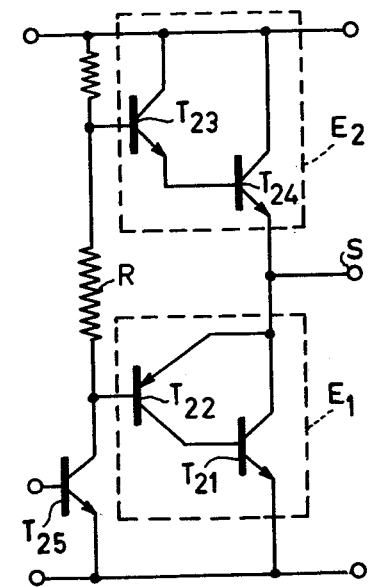
Figure 6:
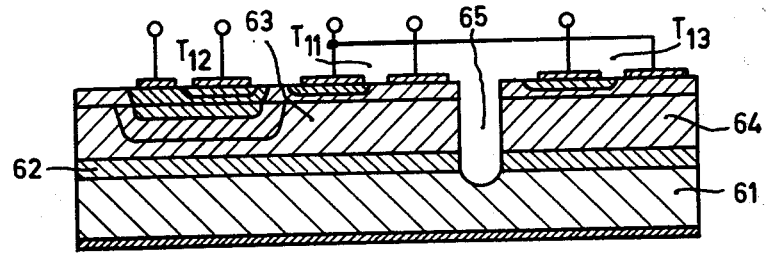
Figure 7:
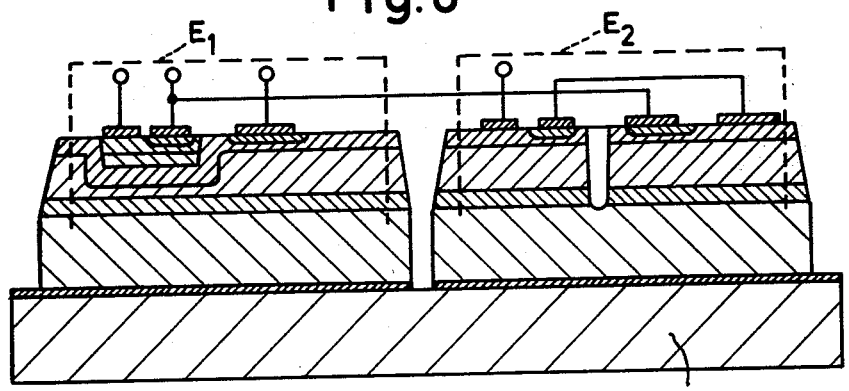
Figure 8:
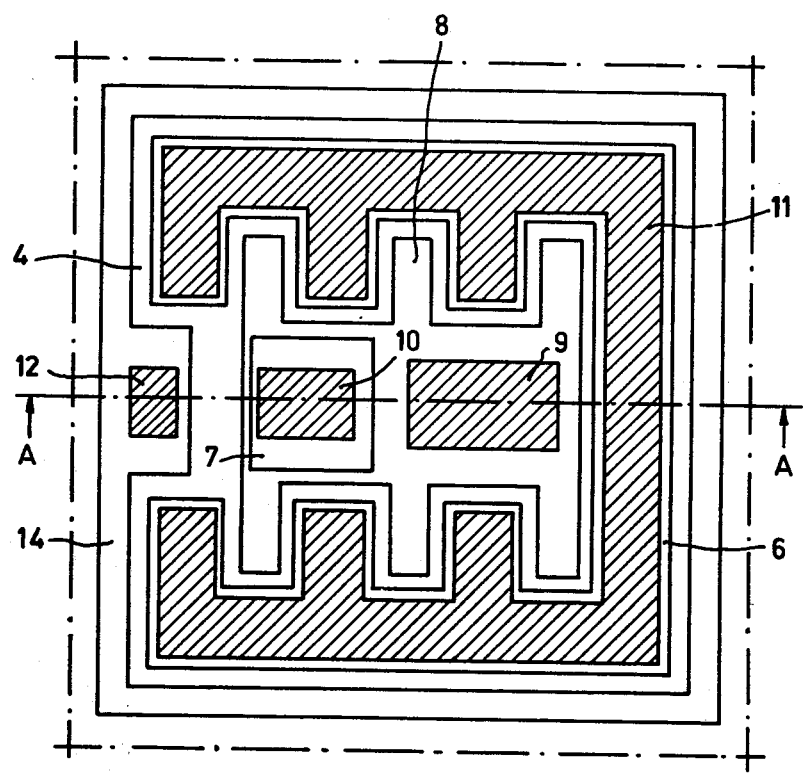

The invention will now be described in greater detail with reference to the accompanying drawings, in which FIG. 1 is the diagram of a structure according to the invention which operates as a Darlington amplifier, FIG. 2 is the diagram of an amplifier having three transistors which comprises a Darlington structure of the type corresponding to FIG. 1, FIG. 3 is a diagram of a push-pull amplifier having a Darlington structure of which the diagram is shown in FIG. 1, FIG. 4 is a diagrammatic cross-sectional view taken on the line AA of FIG. 8 of a first device according to the invention, FIG. 5 is a diagrammatic cross-sectional view of another device according to the invention, FIG. 6 is a diagrammatic cross-sectional view of a monolithic assembly having two transistors corresponding to the diagram of FIG. 2, FIG. 7 is a diagrammatic cross-sectional view of an assembly having four transistors which corresponds to the units E1 and E2 of FIG. 3, FIG. 8 is a plan view of a device according to the invention which corresponds to FIG. 1 and to the cross-sectional view of FIG. 4.

FIGS. 9a to 9j are diagrammatic cross-sectional views of a device according to the invention in successive stages of manufacture.

In most of the above-mentioned figures, the oxide layers which are obtained via thermal treatments or are provided with a special purpose are not shown. Furthermore, the figures are diagrammatic and not drawn to scale in which the geometric proportions of the component parts of the devices were not always respected for reasons of clarity of the drawings; in particular in the cross-sectional views the thickness dimensions are exaggerated.

FIG. 1 shows the diagram which corresponds to a pnp-npn Darlington structure according to the invention in which the first transistor is denoted by $T_1$ and the second by $T_2$, transistor $T_1$ being the output transistor.

As shown in FIG. 2 a structure for the amplification of audio frequency signals is formed by a first npn transistor T11, a second pnp transistor T12 and a third npn transistor T13 of which the structure is the same as that of the transistor T11. The base zone of the first transistor is insulated with respect to the base zone of the third transistor by a groove which is provided from the surface of the device and the depth of which is larger than the thickness of the epitaxial material which constitutes the base zones. The substrate region of the device constitutes a collector zone which is common to the transistors T11 and T13. Said common collector zone constitutes a good thermal connection between the two transistors. Another possibility of incorporating the structure having two complementary transistors according to the invention in a more complex assembly is the realization of a push-pull circuit which comprises two complementary Darlington units as shown in FIG. 3, namely a unit E1 is constituted by a pnp transistor and by an npn transistor according to the invention, and a mixed unit E2 which is constituted by two npn transistors having an epitaxial base, the structure of said two npn transistors corresponding to the structure of the npn transistor of the unit $E_1$, but the surfaces of the two npn transistors being equal to the surfaces of the two transistors of the unit E1. In this manner the two units constitute a complementary pair and are provided on the same base plate with the necessary electric insulation; the monolithic structure which comprises each of the units may also comprise resistors.

As compared with a circuit which comprises an npn-npn Darlington unit and a pnp-pnp Darlington unit, the push-pull arrangement shown in FIG. 3 has the advantage of permitting a larger voltage sweep as a result of a lower minimum output voltage which is available at the point S of the figure.

The device shown in FIGS. 4 and 8 comprises two transistors T1 and T2 which correspond to the two transistors of the Darlington amplifier shown in FIG. 1. The device is provided on a substrate region 1, which is, for example, $n^+$ conductive, the sign + indicating that the doping concentration is comparatively large, larger than $10^{18}$ atoms/cm$^3$. The substrate region 1 is covered with an n-conductive epitaxial surface layer 2 of which the doping concentration is a thousand times weaker than that of the substrate region. The layer 2 is covered with a p-conductive epitaxial layer 3 — the first epitaxial layer — which comprises a $p+$ conductive upper layer 4 which is obtained, for example, by diffusion.

Above a part of the said layer 4 an epitaxial layer 5 shows the n conductivity type and comprises an $n^+$ conductive upper layer 8 which has been obtained, for example, via diffusion. A $n^+$ conductive emitter zone 6 is diffused in the layer 4, while a $p^+$ conductive emitter zone 7 is diffused in the layer 8. By means of metal layers, contacts are provided at 11 on the emitter zone of the transistor T1, at 9 on the base zone of the transistor T2 and at 10 on the emitter zone of the transistor T2. A metal layer 13 ensures the contact with the substrate region 1 which serves as a collector zone of the transistor T2. It is obvious that the surfaces of the device which are not covered with a metal contact layer, are covered with an oxide layer which ensures the insulation and passivation. In order to realize the connection between the collector zone of the transistor T1 and the emitter zone of the transistor T2, a contact 12 is provided on the collector 1 in the bottom of a groove 14.

In the device the base zone of the transistor T2 shows a mesa structure; the thickening which constitutes said structure may impede the provision of reliable electric contacts via vapor deposition.

The structure of the device according to FIG. 5 is the same as that of the preceding device, with the exception that the base zone of the second transistor is present in a cavity in the collector region; the device comprises a substrate region 21 which supports a low-doped layer 22 which in turn supports a first epitaxial layer (23, 24). This layer also shows an upper component layer 24 which is more highly doped and in which the emitter zone 26 of the first transistor is diffused. The layer (23, 24) shows a cavity in which the epitaxial base zone 25 of the second transistor is present. The base zone 25 comprises an upper layer 28 which is highly doped and in which the emitter zone 27 of the second transistor is diffused. The various metal layers 29, 30, 31 and 32 which are provided on the base zone of the second transistor, on the emitter zone of the second transistor, on the emitter zone of the first transistor and on the base zone of the first transistor, respectively, serve for contacting purposes. The substrate region is covered on its lower side with a metal layer 34.

The zone 35 of the highly doped layer 24 ensures a minimum amplification of the stray transistor which is constituted by the substrate region 21, the epitaxial layer 23 and the epitaxial layer 25.

The structure of the device shown in FIG. 5 may also be recognized in the device shown in FIG. 6 and this device comprises in addition a third transistor T13, which is in agreement with FIG. 2. The two transistors T11 and T12 constitute a pnp-npn Darlington circuit. The two transistors T11 and T13 constitute an npn-npn Darlington circuit and have a common collector zone which is constituted by the substrate region 61 which has a low-doped surface layer 62. The base zones 63 and 64 of the transistors T11 and T13 are insulated from each other by a groove 65 which, if desired, may be filled with an insulating material or which may be coated with an insulating material and then be filled with another material up to the level of the upper face of the device.

The transistors T11 and T13 have the same structure but the surface dimensions of the transistor T13 are larger than those of the transistor T11, which usually is the case in monolithic npn-npn Darlington circuits.

The structure of the device shown in FIG. 5 may also be recognized in the device shown in FIG. 7 and this device comprises in addition a monolithic epitaxial npn-npn Darlington circuit which corresponds to the unit E2 of the push-pull amplifier shown in FIG. 3, while the pnp-npn Darlington circuit corresponds to the unit E1 of the said push-pull amplifier. The two units E1 and E2 are provided on the same support 71 and are then accommodated in the same package which, if desired, may comprise other elements of the amplifier.

The principal stages in the manufacture of a device according to the invention will now be described with reference to FIGS. 9a to 9j. As an example was chosen the manufacture of a Darlington circuit which corresponds to FIG. 1 and to the diagrammatic cross-sectional view shown in FIG. 4.

Figure 9A:
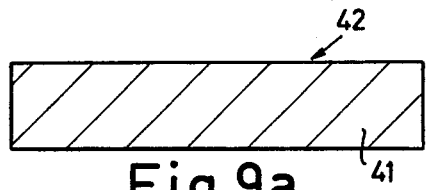

Starting material is a substrate 41 of $n^+$ conductive silicon, 300$\mu$ thick, and an antimony doping which gives rise to a resistivity of 0.01 Ohm.cm (FIG. 9a). On a surface 42 of the substrate which has been prepared in the correct manner an n conductive epitaxial surface layer 43 is then provided (FIG. 9b) with a phosphorus doping which gives rise to a resistivity of 3 Ohm.cm and a thickness of 10$\mu$, and then a p conductive epitaxial layer 44 (FIG. 9c) (the "first" epitaxial layer) with boron doping, in which the thickness of the layer 44 is between 15$\mu$ and 20$\mu$ and its resistivity is 8 Ohm.cm.

Figure 9F:
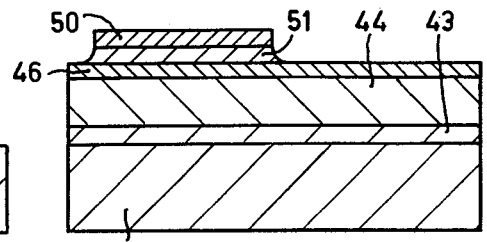
Figure 9B:
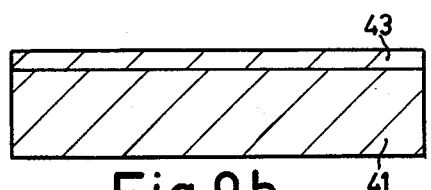
Figure 9G:
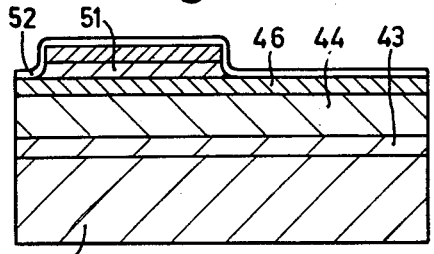
Figure 9C:
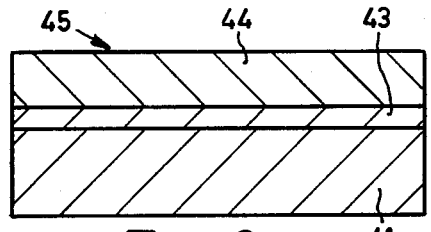
Figure 9H:
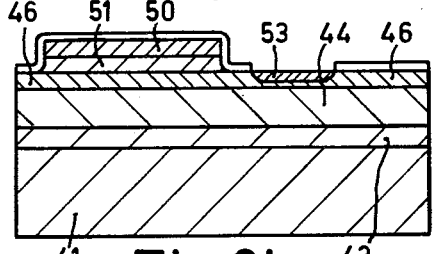
Figure 9D:
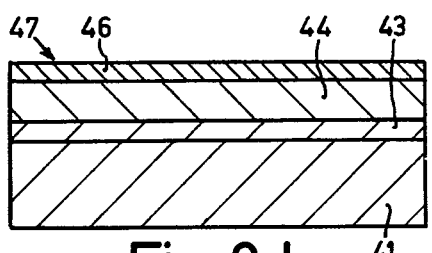
Figure 9I:
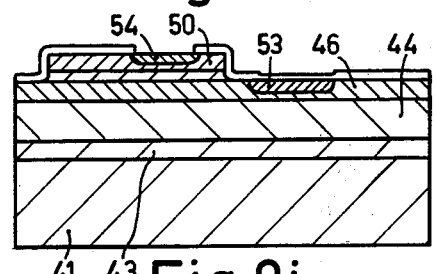

Via the surface 45 of the epitaxial layer 44 boron is then diffused down to a depth of 5$\mu$ so as to obtain in this manner an upper layer 46 whose sheet resistance is equal to 100 Ohm per square (FIG. 9d).

An n conductive epitaxial layer 48 of silicon (the "second" epitaxial layer) is then provided on the surface 47 of the layer 46 with phosphorus doping, in which the thickness of said layer is 12 $\mu$ and its resistivity 3 Ohm.cm.

Figure 9E:
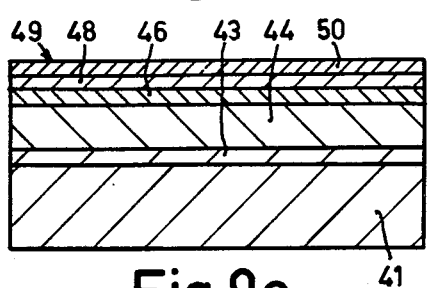

Phosphorus is then diffused in the surface 49 of the said layer 48, which gives rise to the $n^+$ conductivity type, said diffusion occurring down to a depth of 3$\mu$ so as to obtain in this manner a layer 50 having a sheet resistance of 100 Ohm per square (FIG. 9e).

After providing a mask which screens at least a surface which corresponds to the base zone of the pnp transistor, a localized etching is carried out down to the layer 44. The etching is carried out in such manner that a part 51 of the epitaxial layer 48 remains, and part 51 constitutes the base zone of the pnp transistor (FIG. 9f). The etching is succeeded by a surface oxidation so as to obtain in this manner an oxide layer 52 of 0.5$\mu$ thickness (FIG. 9f).

Via apertures provided in the oxide layer 52, it is then possible to diffuse the emitter zone 53 of the npn transistor (FIG. 9h) with phosphorus, in which case the emitter zone 53 becomes $n^+$ conductive, and then to form the emitter zone 54 of pnp transistor (FIG. 9) by a boron diffusion, in which case the emitter zone 54 becomes $p^+$ conductivity type.

When several identical devices are provided in this manner in the same substrate, the devices are then severed. For that purpose a set of grooves is formed by etching, each groove surrounding certain patterns and ensuring the mutual electric separation of the devices, after which the etched surfaces are passivated.

Figure 9J:
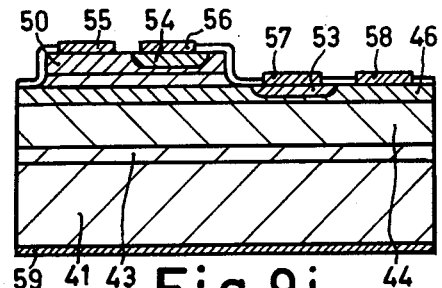

Apertures are then provided in the oxide layer so as to provide the necessary contacts 55 to 58. This is carried out by means of a metal deposit, preferably vapor-deposited aluminum with a thickness of 3$\mu$; the aluminum layer 6 formed is then etched to the desired shape in the usual manner (FIG. 9j). A metallization 59 which is to ensure the contact with the substrate 41 is provided on the oppositely located surface of the device. In this stage, the connection between the collector zone 41 and the emitter zone 54 may also be provided by forming a contact with the collector zone 41 on the bottom of the groove which surrounds each device.

After providing the metallization 59 the devices are severed and provided on base plates. The connection between the collector 41 and the emitter 54 may also be effected by means of a metal wire which is secured at one end to the contact 56 and at the other end to the base plate on which the substrate is provided.

What is claimed is:

1. A semiconductor device having vertical complementary bipolar transistors each with epitaxial base zone, comprising:
   a. a semiconductor body having a substrate region of a first type conductivity;
   b. a first epitaxial layer of a second type conductivity opposite to that of said first type conductivity, overlying said substrate region;
   c. a second epitaxial layer portion of said first conductivity type overlying only the surface of a first portion of said first epitaxial layer;
   d. a first transistor comprising:
      i. an emitter zone of said first type conductivity in a second portion of said first epitaxial layer, an emitter connection at the top surface of said first epitaxial layer, said second portion of said first epitaxial layer being adjacent to said first portion,
      ii. a collector connection to the substrate region adjoining said second portion of said first epitaxial layer,
      iii. the base zone of said first transistor being constituted by said second portion of said first epitaxial layer, and
   e. a second transistor complementary to said first transistor comprising:
      i. a base connection at the top surface of said second epitaxial layer, the base zone of said second transistor being constituted by said second epitaxial layer,
      ii. said first portion of said first epitaxial layer constituting the collector of said second transistor and being internally connected to the adjoining second portion of said first epitaxial layer constituting said base zone of said first transistor, and
      iii. an emitter zone of said second type conductivity in said second epitaxial layer portion and an emitter connection thereto at the top surface of said second epitaxial layer portion. pg,27

2. A semiconductor device as claimed in claim 1, wherein said first portion of said first layer which constitutes said collector of said second transistor is thinner than said second portion of said first layer which constitutes said base zone of said first transistor, the difference in thickness being substantially equal to the thickness of the layer which constitutes said base zone of said second transistor.

3. A semiconductor device as claimed in claim 1, wherein said first epitaxial layer consists of at least two overlying component layers, said upper component layer having a higher doping concentration than said lower component layer which adjoins said substrate region.

4. A semiconductor device as claimed in claim 1, wherein said substrate region comprises a surface layer having a lower doping concentration than the underlying part of said substrate region, said first epitaxial layer extending over said surface layer.

5. A semiconductor device as claimed in claim 1, wherein said base zone of said second transistor comprises first and second vertically continuous layers, said first layer adjoining said top surface of said second epitaxial layer being more highly doped than the underlying said second layer.

6. A semiconductor device as claimed in claim 1, further comprising a third transistor whose corresponding active zones have the same conductivity type as those of said first transistor, said base zones of said first and said third transistor being insulated from each other by a groove whose depth is greater than the thickness of said first layer at the area of said base zones, the substrate comprising a common collector zone of said first and said third transistor.

7. A device as defined in claim 1, wherein the internal connection of said first transistor base zone and said second transistor collector is constituted by a common part of said first epitaxial layer between said first and said second portions.

8. A device as set forth in claim 1, wherein the emitter zones of both said first and said second transistor are diffused zones.

9. A semiconductor device as claimed in claim 1, wherein said substrate region is n-type conductivity, said first epitaxial layer is p-type conductivity, and said second epitaxial layer is n-type conductivity.

10. A semiconductor device as claimed in claim 9, further comprising an npn third transistor of the same structure as said first transistor, the collector zone of which is constituted by said substrate region, and the base zone by said first epitaxial layer, said third transistor being separated from said first transistor by a groove which extends at least down to said substrate region.

11. A semiconductor device as claimed in claim 10, further comprising a second semiconductor body having two further transistors of the same structure as said first transistor connected according to a Darlington circuit.

12. A semiconductor device having vertical complementary bipolar transistors each with epitaxial base zone, comprising:
   a. a semiconductor body having a substrate region of a first type conductivity,
   b. a first epitaxial layer of a second type conductivity opposite to that of said first type conductivity on said substrate region,
   c. a cavity in the surface of only a first portion of said first epitaxial layer, said cavity extending only partly through said first portion of said first epitaxial layer,
   d. said cavity being filled with a second epitaxial layer portion of said first type conductivity,
   e. a first transistor comprising:
      i. an emitter zone of said first type conductivity in a second portion of said first epitaxial layer and an emitter connection thereto at the top surface of said first epitaxial layer, said second portion of said first epitaxial layer being adjacent to said first portion,
      ii. a collector connection to said substrate region adjoining said second portion of said first epitaxial layer,
      iii. the base zone of said first transistor being constituted by said second portion of said first epitaxial layer, and
   f. a second transistor complementary to said first transistor comprising:

i. a base connection at the top surface of said second epitaxial layer, the base zone of said second transistor being constituted by said second epitaxial layer,
ii. said first portion of said first epitaxial layer constituting the collector of said second transistor and being internally connected to the adjoining second portion of said first epitaxial layer constituting said base zone of said first transistor, and
iii. an emitter zone of said second type conductivity in said second epitaxial layer portion and an emitter connection thereto at the top surface of said second epitaxial layer portion.

13. A device as defined in claim 12, wherein the internal connection of said first transistor base zone and said second transistor collector is constituted by a common part of said first epitaxial layer between said first and said second portions.

14. A device as defined in claim 12, wherein the emitter zones of both said first and said second transistor are diffused zones.

15. A device as defined in claim 12, further comprising a third epitaxial layer of said first type conductivity but lower doping concentration than that of said substrate region epitaxially situated on said substrate region surface to provide a surface layer having a lower doping concentration than said substrate.

* * * * *